(12) United States Patent
Song et al.

(10) Patent No.: US 8,050,079 B2
(45) Date of Patent: Nov. 1, 2011

(54) NONVOLATILE MEMORY DEVICE USING VARIABLE RESISTIVE ELEMENT

(75) Inventors: Young-Sun Song, Hwaseong-si (KR); Ho-Jung Kim, Suwon-si (KR); Sang-Beom Kang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 104 days.

(21) Appl. No.: 12/577,888

(22) Filed: Oct. 13, 2009

(65) Prior Publication Data

US 2010/0091552 A1 Apr. 15, 2010

(30) Foreign Application Priority Data

Oct. 14, 2008 (KR) .................. 10-2008-0100672

(51) Int. Cl.
*G11C 11/00* (2006.01)
*G11C 11/36* (2006.01)

(52) U.S. Cl. .................. 365/148; 365/163; 365/175
(58) Field of Classification Search .................. 365/148, 365/163, 175
See application file for complete search history.

(56) References Cited

U.S. PATENT DOCUMENTS

| | | | |
|---|---|---|---|
| 6,653,889 B2 | 11/2003 | Jang et al. | |
| 6,992,905 B2 | 1/2006 | Jung | |
| 7,042,757 B2 * | 5/2006 | Perner ........................ | 365/148 |
| 7,283,387 B2 * | 10/2007 | Cho et al. .................... | 365/148 |
| 7,298,642 B2 * | 11/2007 | Ise ............................... | 365/148 |
| 7,397,681 B2 * | 7/2008 | Cho et al. .................... | 365/148 |
| 7,457,151 B2 * | 11/2008 | Cho et al. .................... | 365/148 |
| 7,480,167 B2 * | 1/2009 | Ahn ............................. | 365/148 |
| 7,502,252 B2 * | 3/2009 | Fuji et al. .................... | 365/148 |
| 7,511,993 B2 * | 3/2009 | Choi et al. ................... | 365/148 |
| 7,548,446 B2 * | 6/2009 | Kim et al. .................... | 365/148 |
| 7,577,018 B2 * | 8/2009 | Kurisu ......................... | 365/148 |
| 7,609,545 B2 * | 10/2009 | Osada et al. ................. | 365/148 |
| 7,668,005 B2 * | 2/2010 | Ueda ............................ | 365/148 |
| 7,710,767 B2 * | 5/2010 | Cho et al. .................... | 365/148 |
| 7,724,560 B2 * | 5/2010 | Kang et al. ................... | 365/148 |
| 7,787,316 B2 * | 8/2010 | Katagiri ....................... | 365/148 |
| 7,808,817 B2 * | 10/2010 | Cho et al. .................... | 365/148 |

FOREIGN PATENT DOCUMENTS

| | | |
|---|---|---|
| KR | 1020020095912 A | 12/2002 |
| KR | 1020030010350 A | 2/2003 |
| KR | 1020050044086 A | 5/2005 |
| KR | 1020070002805 A | 1/2007 |

* cited by examiner

*Primary Examiner* — Trong Phan
(74) *Attorney, Agent, or Firm* — Volentine & Whitt, PLLC

(57) ABSTRACT

A nonvolatile memory device, using a resistance material, includes a memory cell array having nonvolatile memory cells arranged in a matrix, multiple bit lines, a column selection circuit and column drivers. The bit lines are coupled to columns of the nonvolatile memory cells in the memory cell array. The column selection circuit selects at least one bit line in response to column selection signals. Each column driver supplies a column selection signal, and includes a first charge unit that charges an output port of the column driver to a first voltage level in response to a first charge signal, a second charge unit that charges the output port of the column driver to a second voltage level from the first voltage level in response to a second charge signal, and a current controller that controls a current path from the second charge unit to the first charge unit.

6 Claims, 7 Drawing Sheets

NONVOLATILE MEMORY DEVICE USING VARIABLE RESISTIVE ELEMENT

CROSS REFERENCE TO RELATED APPLICATION

A claim of priority is made to Korean Patent Application No. 10-2008-0100672 filed on Oct. 14, 2008, in the Korean Intellectual Property Office, the subject matter of which is hereby incorporated by reference.

BACKGROUND

The inventive concept relates generally to a nonvolatile memory device using a variable resistive element.

Examples of nonvolatile memory devices that use resistance material include phase change random access memory (PRAM), resistive random access memory (RRAM), magnetic RAM (MRAM), and the like. While dynamic random access memory (DRAM) or flash memory stores data using an electric charge, a nonvolatile memory device that uses resistance material stores data using a change in resistance of a variable resistive material (e.g., RRAM), a change in state of a phase change material (e.g., PRAM), such as a chalcogenide alloy, and a change in resistance of a magnetic tunnel junction (MTJ) thin film due to a magnetization state of a ferromagnetic substance (e.g., MRAM).

The following description uses a phase change memory cell as an example. A state of the phase change material is changed to a crystalline state or an amorphous state while being cooled down after a heating process. Since the phase change material in the crystalline state has low resistance and the phase change material in the amorphous state has high resistance, the crystalline state may be defined as set data or 0 data, and the amorphous state may be defined as reset data or 1 data.

SUMMARY

According to an aspect of the inventive concept, there is provided a nonvolatile memory device using a variable resistive element, including a memory cell array, multiple bit lines, a column selection circuit and column drivers. The memory cell array includes nonvolatile memory cells arranged in a matrix. The bit lines are coupled to columns of the nonvolatile memory cells in the memory cell array. The column selection circuit selects at least one bit line of the multiple bit lines in response to column selection signals. The column drivers supply the column selection signals, where each column driver includes a first charge unit that charges an output port of the column driver to a first voltage level in response to a first charge signal, a second charge unit that charges the output port of the column driver to a second voltage level from the first voltage level in response to a second charge signal, and a current controller that controls a current path from the second charge unit to the first charge unit.

According to another aspect of the inventive concept, there is provided a nonvolatile memory device using a variable resistive element, including a memory cell array, multiple bit lines, a column selection circuit and column drivers. The memory cell array includes nonvolatile memory cells arranged in a matrix. The bit lines are coupled to columns of the nonvolatile memory cells in the memory cell array. The column selection circuit selects at least one bit line among the multiple bit lines in response to column selection signals. The column drivers supply the column selection signals through corresponding output ports. Each column driver varies a voltage level of the output port to a first voltage level in response to a first charge signal and to a second voltage level in response to a second charge signal. A time difference period occurs between a first period during which the first charge signal is enabled and a second period during which the second charge signal is enabled, and the output port of the column driver is kept at the first voltage level during the time difference period.

BRIEF DESCRIPTION OF THE DRAWINGS

Various embodiments of the inventive concept will be described in further detail with reference to the attached drawings, in which.

DETAILED DESCRIPTION OF THE EMBODIMENTS

Figure 1:
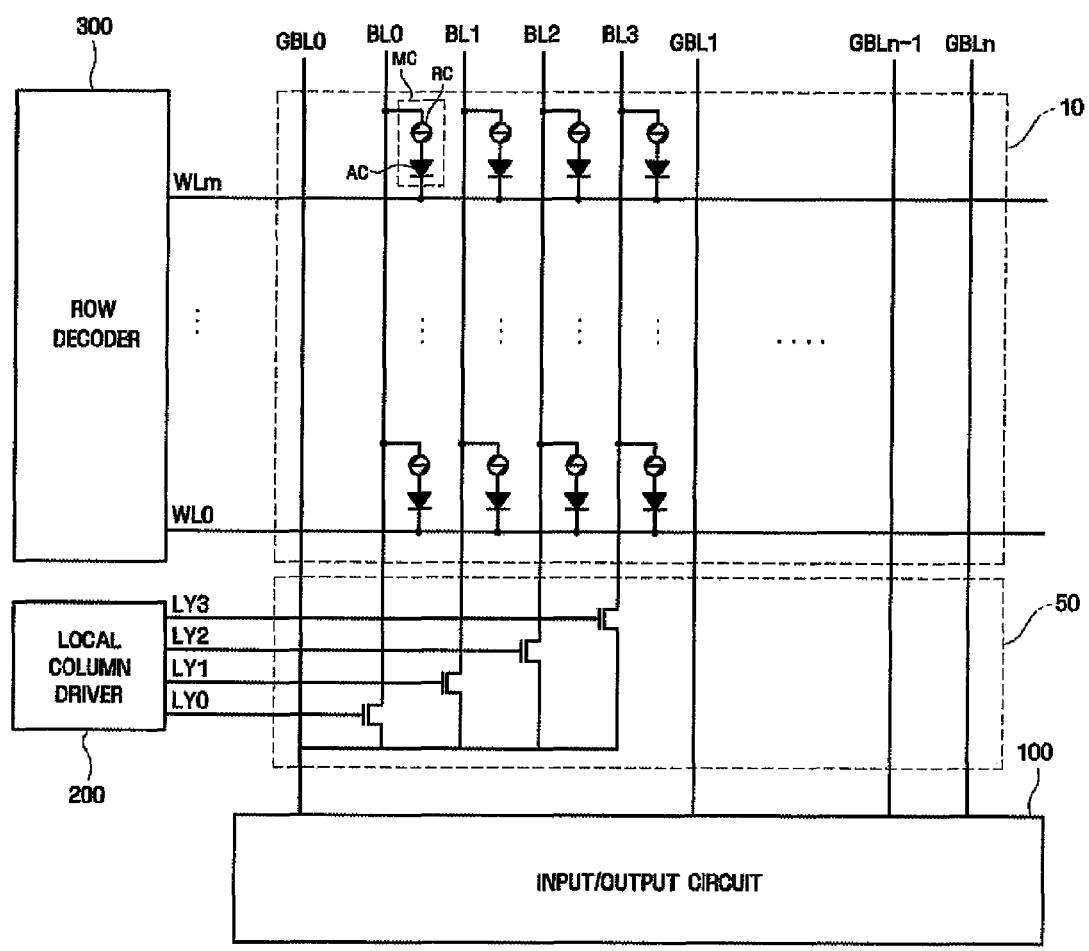
FIG. 1 is a block diagram illustrating a nonvolatile memory device, according to a first embodiment.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. Throughout the drawings and written description, like reference numerals will be used to refer to like or similar elements. As used herein, the term "and/or" includes any and all combinations of one or more of the associated listed items.

It will be understood that, although the terms first, second, etc., may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

In addition, when terms used in this specification are not specifically defined, all the terms used in this specification (including technical and scientific terms) can be understood by those skilled in the art. Further, when general terms defined in dictionaries are not specifically defined herein, the terms will have the normal meaning in the art.

The following description is directed to embodiments of the inventive concept using phase change random access memory (PRAM) devices. However, it will be understood by those of ordinary skill in the art that the present inventive concept can be applied to nonvolatile memory devices that use resistance materials, such as resistive random access memory (RRAM) devices, ferroelectric random access memory (FRAM) devices, and the like.

FIG. 1 is a block diagram illustrating a nonvolatile memory device, according to a first illustrative embodiment of the inventive concept. For brevity of explanation, FIG. 1 shows the nonvolatile memory device implemented using a hierarchical word line structure having global bit lines and local bit lines, and particularly, four local bit lines selectively connected to each of the global bit lines, by way of example. However, the inventive concept is not limited to the illustrated embodiment. In alternative embodiments, for example, the nonvolatile memory device may not be implemented using the global bit lines of a hierarchical word line structure, and the number of local bit lines coupled to each may vary according to various design requirements and specifications. In the illustrated embodiment, a global column selection circuit and a global column driver are not shown, for brevity of explanation.

Referring to FIG. 1, the nonvolatile memory device includes a memory cell array 10, a row decoder 300, a local column selection circuit 50, a global column selection circuit (not shown), local column drivers 200, global column drivers (not shown), and an input/output circuit 100.

The memory cell array 10 includes multiple nonvolatile memory cells MC arranged in a matrix. Rows of the multiple nonvolatile memory cells MC are coupled to multiple word lines WL0 to WLm, and columns the multiple nonvolatile memory cells MC are coupled to multiple bit lines, respectively.

Voltages of the multiple word lines WL0 to WLm are adjusted by the row decoder 300 and a row of the multiple word lines WL0 to WLm is selected. One of the multiple bit lines is selected by the local column selection circuit 50 operating in response to a column selection signal supplied from a corresponding local column driver 200. When one among the multiple nonvolatile memory cells MC is selected, data may be output from or input to the selected nonvolatile memory cell MC through the input/output circuit 100.

Each of the nonvolatile memory cells MC, for example, may include a variable resistive element RC that includes a phase change material having two different resistances according to a crystalline state and an amorphous status, and an access element AC that controls current flow in the variable resistive element RC. The access element AC may be a diode or a transistor coupled to the variable resistive element RC in series, for example. A diode is illustrated as the variable access element AC in FIG. 1, but the memory cell MC is not limited to this configuration. The phase-change nonvolatile memory device using a diode as the access element AC is referred to as a diode-controlled PRAM cell. In an embodiment, GeSbTe, consisting of germanium (Ge), antimony (Sb) and tellurium (Te), is used as the phase change material. However, the phase change material may use various materials, for example, including two atomic compounds, such as GaSb, InSb, InSe, $Sb_2Te_3$, or GeTe, three atomic compounds, such as GeSbTe, GaSeTe, InSbTe, $SnSb_2Te_4$, or InSbGe, or four atomic compounds, such as AgInSbTe, (GeSn)SbTe, GeSb(SeTe), or $Te_{81}Ge_{15}Sb_2S_2$.

As shown in FIG. 1, the nonvolatile memory device has higher capacity and higher integration density through implementation of a hierarchical bit line structure using multiple global bit lines GBL0-GBLn and multiple local bit lines BL0-BL3. Each of the global bit lines GBL0-GBL3 are selectively coupled to the multiple local bit lines BL0-BL3. Each of the multiple local bit lines BL0-BL3 are coupled to rows of the nonvolatile memory cells MC.

In this case, a column selection circuit includes the local column selection circuit 50 and the global column selection circuit (not shown). The local column selection circuit 50 selectively couples each of the global bit lines GBL0-GBLn to the multiple local bit lines BL0-BL3 in response to local column selection signals LY0-LY3, and may include multiple local column selection transistors coupled to the local bit lines BL0-BL3, respectively. Similarly, the global column selection circuit selectively couples the input/output circuit 100 to the multiple global bit lines GBL0-GBLn in response to global column selection signals, and may include multiple global column selection transistors coupled to the global bit lines GBL0-GBLn, respectively.

In addition, when the nonvolatile memory device is implemented by a hierarchical bit line structure, a column driver may include the local column drivers 200 supplying the local column selection circuit 50 with local column selection signals LY0-LY3, and the global column drivers (not shown) supplying the global column selection circuit with global column selection signals. When supplying the local column selection signals LY0-LY3 and/or the global column selection signals, the local column drivers 200 and/or the global column selection drivers each have output ports for gradually changing or varying voltage levels between a first voltage level and a second voltage level, in order to supply local column selection signals LY0-LY3 and/or global column selection signals having the second voltage level.

Varying the voltage levels between the first and second voltage levels is described below with reference to FIGS. 2 through 7, according to various embodiments. The description uses the local column drivers 200 as an example, for the sake of explanation, but the embodiments are not limited to this configuration. It is understood that the global column drivers may have substantially the same configuration as that of the local column drivers 200.

Figure 2:
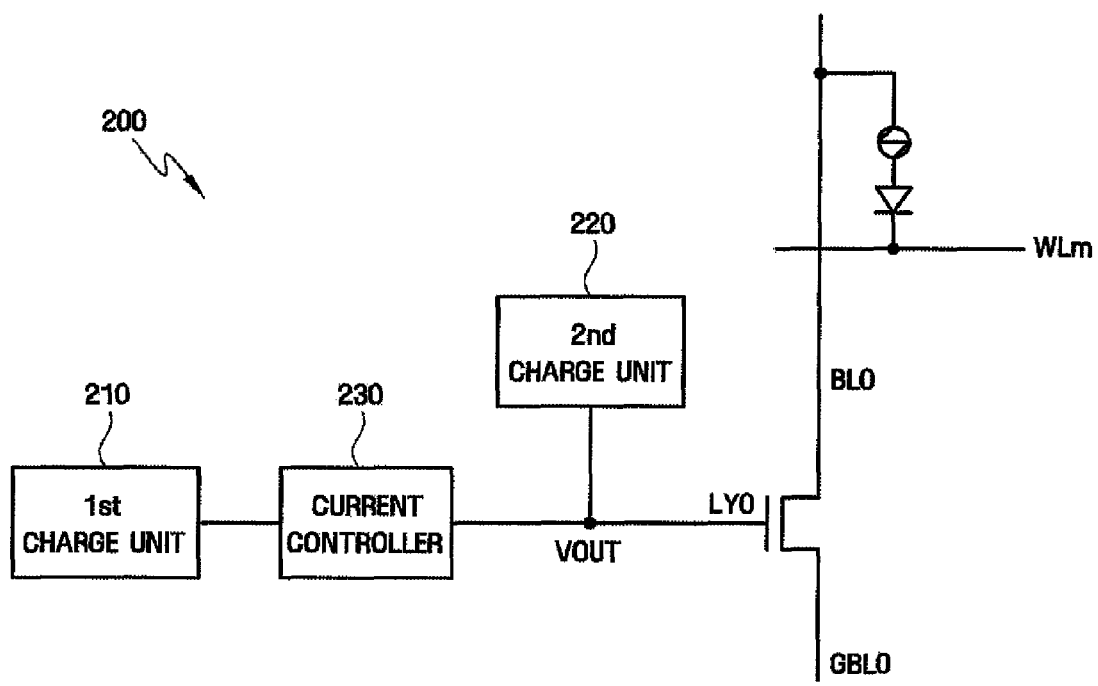
FIG. 2 is a block diagram illustrating a local column driver of the nonvolatile memory device shown in FIG. 1.

FIG. 2 is a block diagram illustrating a local column driver of the nonvolatile memory device shown in FIG. 1, according to an embodiment.

Referring to FIG. 2, a local column driver 200 of the nonvolatile memory device shown in FIG. 1 supplies local column selection signal LY0 having the second voltage level by gradually changing the voltage level of the corresponding output port VOUT from the first voltage level to the second voltage level. For brevity of explanation, FIG. 2 depicts only one local column driver 200 for supplying voltage levels of the local column section signal LY0 at corresponding output port VOUT. However, it is understood that the local column drivers 200 indicated in FIG. 1 for supplying local column selection signals LY1-LY3 through corresponding output ports VOUT include substantially the same circuitry, according to the various embodiments.

The local column driver 200 of FIG. 2 includes a first charge unit 210, a second charge unit 220 and a current controller 230 for controlling the voltage level of the output port VOUT. The first charge unit 210 charges the output port VOUT of the local column driver 200 to the first voltage level in response to first charge signal. The first charge unit 210 charges the output port VOUT to the first voltage level using a power supply voltage, for example.

Similarly, the second charge unit 220 charges the output port VOUT of the local column driver 200 to the second voltage level, which is higher than the first voltage level, in response to second charge signal. The second charge unit 220 may charge the output port VOUT to the second voltage level using a boosted power supply voltage, for example, formed by a boost voltage circuit (not shown) of the nonvolatile memory device.

Use of the boosted power supply voltage in forming the local column selection signals LY0-LY3 having the second voltage level increases power consumption of the nonvolatile memory device. In particular, a large amount of current may be consumed due to poor efficiency of the boost voltage circuit for forming the boosted power supply voltage.

However, the local column drivers 200 of the nonvolatile memory device according to the first embodiment generates the local column selection signals LY0-LY3 having the second voltage level in stages, respectively using the power supply voltage and the boosted power supply voltage, rather than at once, using only the boosted power supply voltage, thus limiting the overall use of the boosted power supply voltage. Accordingly, the amount of current consumed by the local column drivers 200 of the nonvolatile memory device is reduced.

The current controller 230 is coupled between the first charge unit 210 and the second charge unit 220, and controls a current path to be established from the second charge unit 220 to the first charge unit 210. For example, the current controller 230 may restrict or prevent the flow of current from the second charge unit 220 to the first charge unit 210, which uses a voltage level lower than that used by the second charge unit 220.

Therefore, the nonvolatile memory device according to the first embodiment is able to prevent the current from flowing from the second charge unit 220, which uses the boosted power supply voltage formed by the boost voltage circuit, to the first charge unit 210, which uses the relatively low power supply source voltage. This reduces the amount of current consumed by each of the local column drivers 200.

Figure 3:
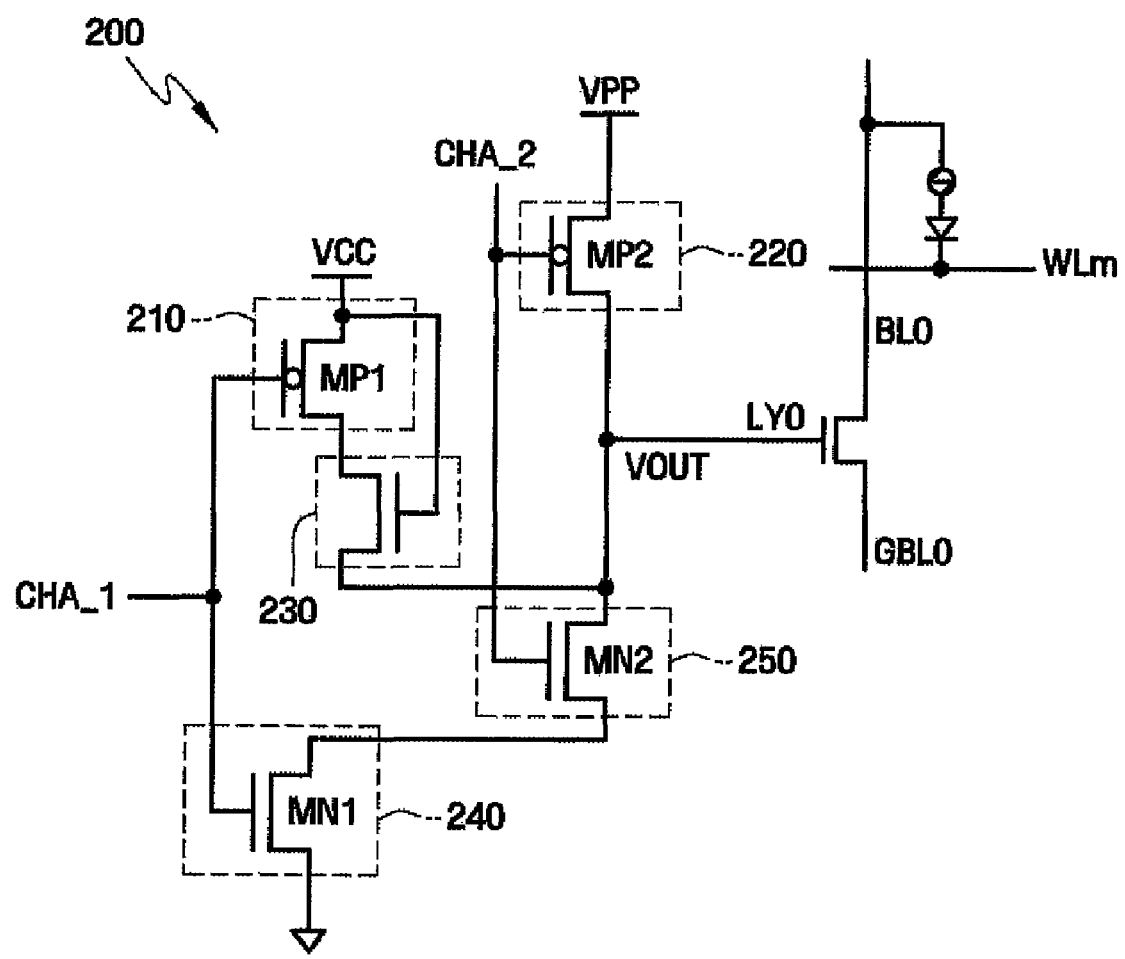
FIG. 3 is a circuit diagram illustrating a representative local column driver shown in FIG. 2.

FIG. 3 is a circuit diagram illustrating a representative local column driver shown in FIG. 2, according to an embodiment.

The configuration of the local column driver shown in FIG. 3 is provided as an example. It is understood that other configurations may be provided without departing from the scope of the disclosure.

Referring to FIG. 3, the local column driver 200 includes a first charge unit 210, a second charge unit 220, a current controller 230, a discharge unit 240 and a switch 250. The first charge unit 210 charges the output port VOUT of the local column driver 200 to the first voltage level in response to the first charge signal CHA_1. The first charge unit 210 is coupled between the output port VOUT of the local column driver 200 and the power supply voltage VCC, and may include a PMOS transistor MP1 having a gate to which the first charge signal CHA_1 is applied. The first charge unit 210 may charge the output port VOUT of the local column driver 200 to a lower level, e.g., about a threshold voltage Vth of an NMOS transistor (or diode) of the current controller 230, than the power supply voltage VCC.

Meanwhile, the first charge signal CHA_1 supplied to the first charge unit 210 may include signals supplied to local column drivers 200 connected to the multiple local column selection transistors of the local column selection circuit (e.g., column selection circuit 50 of FIG. 1), irrespective of whether the corresponding local column selection signals LY0-LY3 are supplied or not. For example, the first charge signal CHA_1 may include a signal supplied to a local column driver 200 coupled to a local column selection transistor of a non-selected local bit line of the local bit lines BL0-BL3, as well as a signal supplied to a local column driver 200 coupled to a local column selection transistor of a selected local bit line of the local bit lines BL0-BL3.

Similarly, the second charge unit 220 charges the output port VOUT of the local column driver 200 to the second voltage level from the first voltage level in response to the second charge signal CHA_2. The second charge unit 220 is coupled between the output port VOUT of the local column driver 200 and the power supply voltage VPP, and may include a PMOS transistor MP2 having a gate to which the second charge signal CHA_2 is applied.

Unlike the first charge signal $CHA_{-1}$, the second charge signal CHA_2 is supplied only to the local column drivers 200 supplying the local column selection signals LY0-LY3. For example, the second charge signal CHA_2 may be supplied to only each local column driver 200 coupled to a local column transistor of a selected local bit line of the local bit lines BL0-BL3. In an embodiment, the second charge signal CHA_2 is enabled and supplied after the first charge signal CHA_1 is enabled and supplied. A period during which the second charge signal CHA_2 is enabled at least partially overlaps with a period during which the first charge signal CHA_1 is enabled.

The current controller 230 is coupled between the first charge unit 210 and the second charge unit 220, and controls a current path from the second charge unit 220 to the first charge unit 210. The current controller 230 may include a diode (not shown) or NMOS transistor (shown) coupled between the output port VOUT and the first charge unit 210, and controls the current flowing from the first charge unit 210 using a voltage level lower than that used by the second charge unit 220.

The discharge unit 240 discharges the output port VOUT of the local column driver 200, and is disabled by the first charge signal CHA_1. More particularly, the discharge unit 240 is coupled between the switch 250 and a ground voltage port, and may include an NMOS transistor MN1 having a gate to which the first charge signal CHA_1 is applied.

The switch 250 selectively couples the output port VOUT of the local column driver 200 to the discharge unit 240, and is selectively disabled by the second charge signal CHA_2. The switch 250 may include an NMOS transistor MN2 that is coupled between the output port VOUT of the local column driver 200 and the discharge unit 240, and has a gate to which the second charge signal CHA_2 is applied. Accordingly, each local column driver 200 to which the second charge signal CHA_2 is not applied, that is, local column drivers 200 that do not supply local column selection signals LY0-LY3 through corresponding output ports VOUT, is coupled to the discharge unit 240 to be discharged.

Figure 4A:
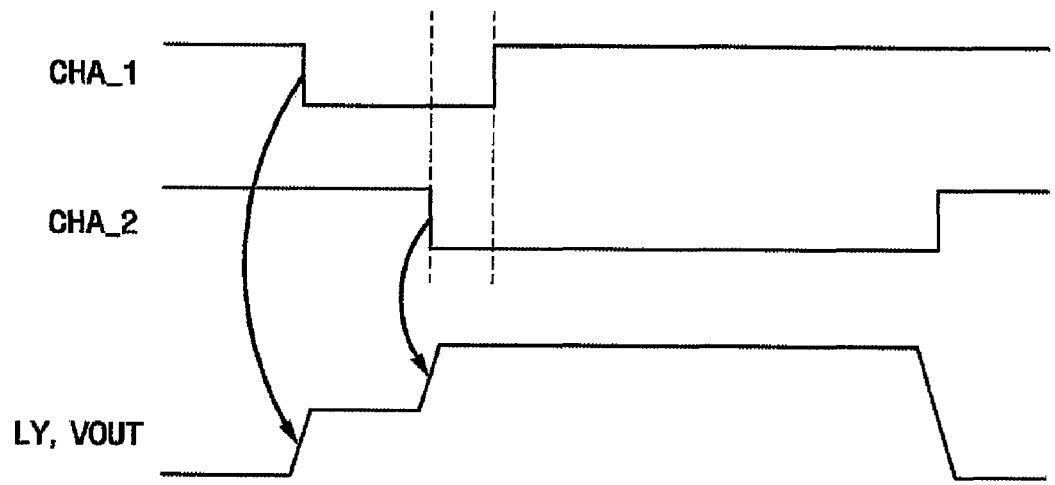
FIGS. 4a and 4b illustrate the operation of the local column driver of the nonvolatile memory device shown in FIG. 1.
Figure 4B:
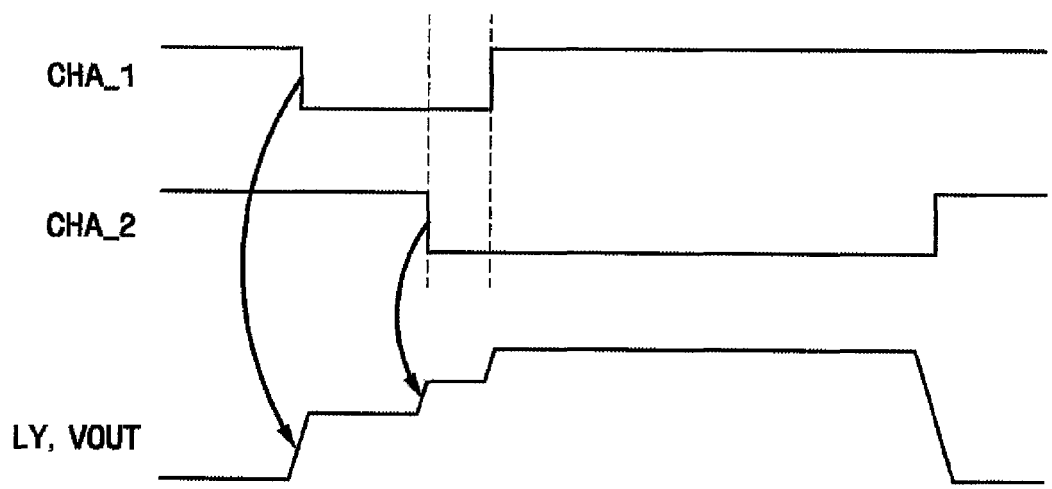

FIGS. 4a and 4b illustrate the operation of the local column driver of the nonvolatile memory device shown in FIG. 1, according to an embodiment.

Referring to FIGS. 2 through 4a, in the nonvolatile memory device, each of the local column selection signals LY (LYO-LY3) having the second voltage level is supplied through the corresponding output port VOUT of the local column driver 200 in stages. That is, the voltage level of the output port VOUT changes to the first voltage level in response to the first charge signal CHA_1, and subsequently changes to the second voltage level in response to the second charge signal CHA_2 in a stepped manner.

As described above, since the first charge unit 210 and the second charge unit 220 are coupled to the output port VOUT of the local column driver 200, a considerable amount of current may be consumed in the local column driver 200 when the period during which the second charge signal CHA_2 is enabled at least partially overlaps the period during which the first charge signal CHA_1 is enabled. In more detail, as shown in FIG. 4b, when the period during which the second charge signal CHA_2 is supplied to enable the second charge unit 220 at least partially overlaps with the period during which the first charge signal CHA_1 is supplied to enable the first charge unit 210, a current path ranging from the second charge unit 220 to the first charge unit 210 may be established, consuming a considerable amount of current in the local column driver 200.

However, in the local column driver 200 of the nonvolatile memory device according to the first embodiment, even when the period during which the first charge signal CHA_1 is enabled at least partially overlaps with the period during which the second charge signal CHA_2 is enabled, the current controller 230 controls the current path from the second charge unit 220 to the first charge unit 210, thereby reducing the amount of current consumed.

Figure 5:
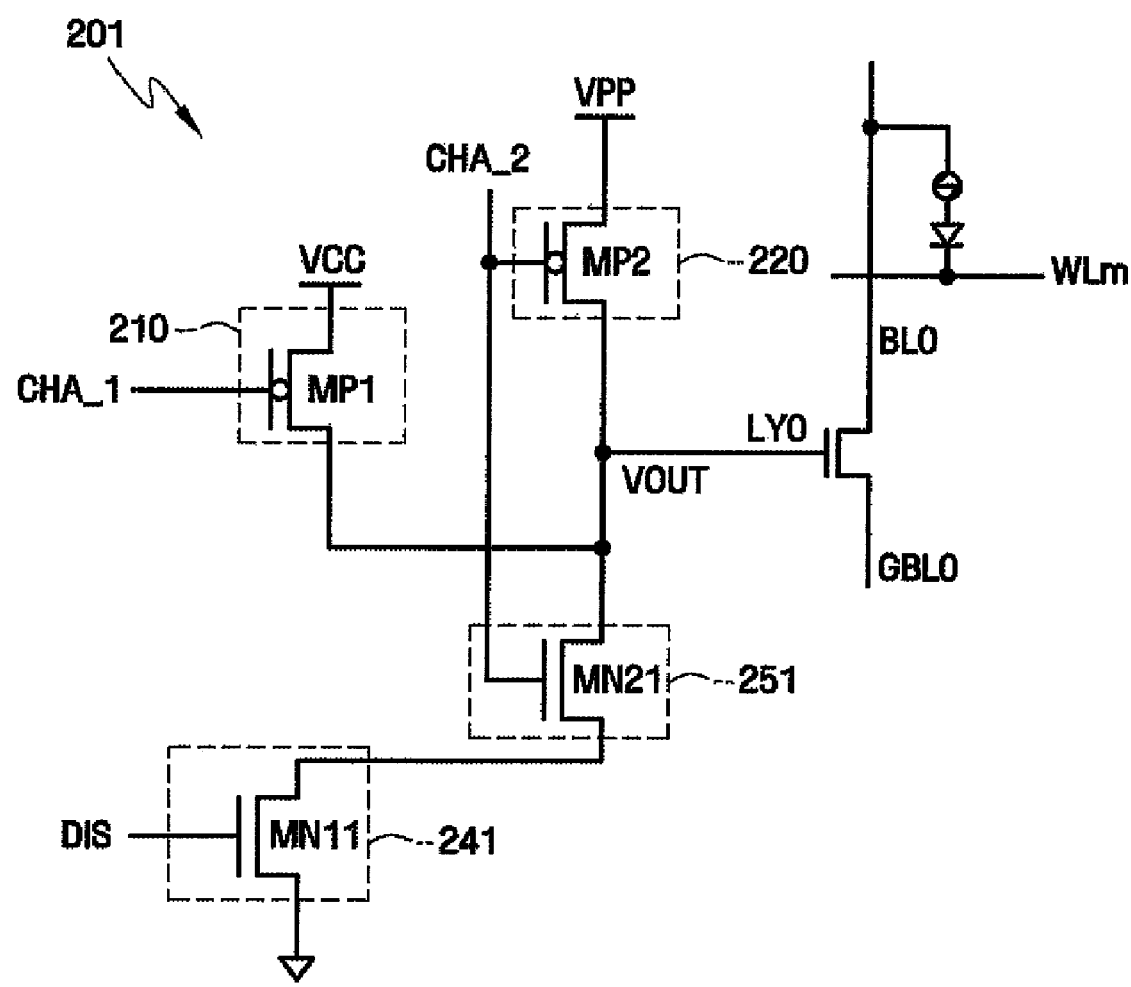
FIG. 5 is a circuit diagram illustrating a representative local column driver of a nonvolatile memory device, according to a second embodiment.
Figure 6A:
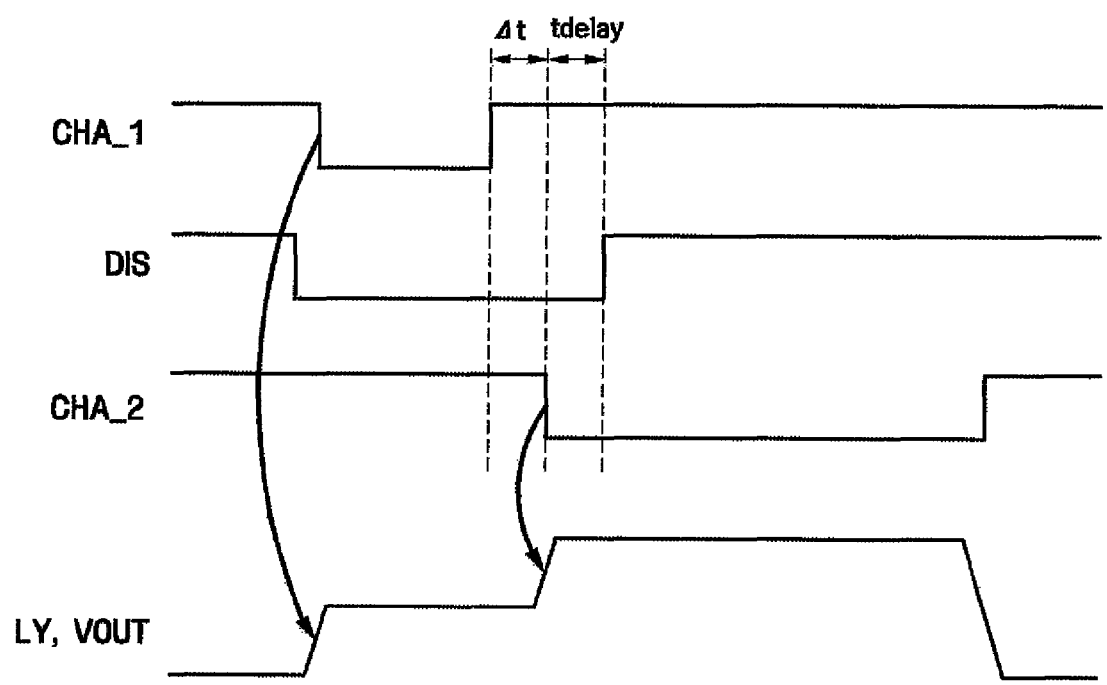
FIGS. 6a and 6b illustrate the operation of the local column driver shown in FIG. 5.
Figure 6B:
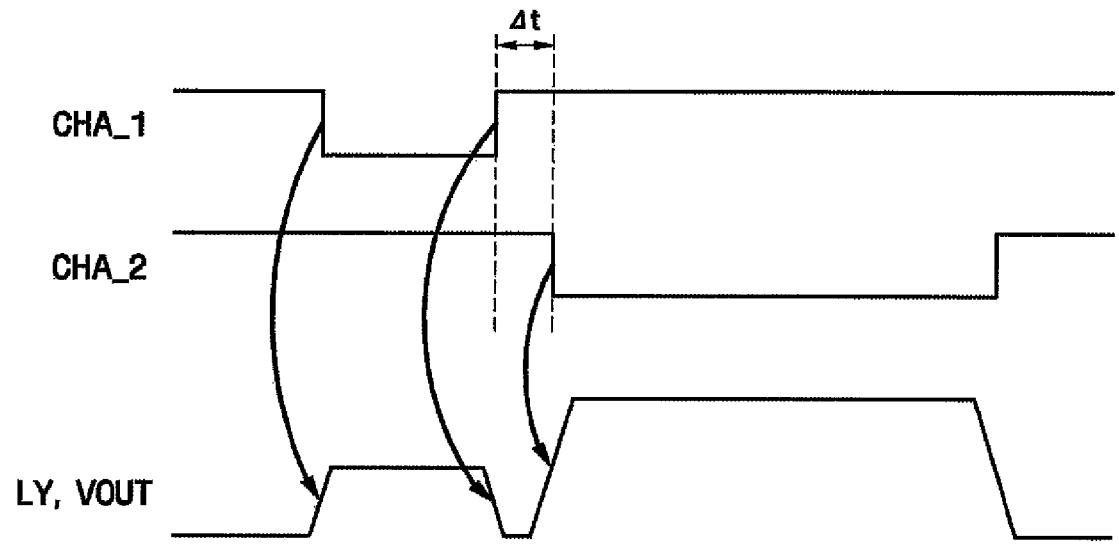

FIG. 5 is a circuit diagram illustrating a representative local column driver of a nonvolatile memory device, according to a second illustrative embodiment of the present inventive concept, and FIGS. 6a and 6b illustrate operation of the local column driver shown in FIG. 5.

Referring to FIGS. 5 and 6b, unlike in the local column driver 200 according to the first embodiment shown in FIG. 3, in the local column driver 201 according to the second embodiment shown in FIG. 5, there is a time difference between a period during which the first charge signal CHA_1 is enabled and a period during which the second charge signal CHA_2 is enabled. Further, the local column driver shown in FIG. 5 does not includes a current controller (e.g., current controller 230), and the discharge unit 241 is supplied with a discharge signal DIS, instead of the first charge signal CHA_1, as described below.

FIG. 6b depicts operation of the local column driver 200 shown in FIG. 3, according to the first embodiment, if there were a time difference between the period during which the first charge signal CHA_1 is enabled and the period during which the second charge signal CHA_2 is enabled. As shown in FIG. 6b, in the time during which the first charge signal CHA_1 and the second charge signal CHA_2 are not supplied (Δt), the discharge unit 240 and the switch 250 would be enabled and the output port VOUT of the local column driver 200 would be discharged. Therefore, when the second charge signal CHA_2 is subsequently supplied to charge the output port VOUT of the local column driver 200 at the second voltage level, the output port VOUT of the local column driver 200 would begin at a level lower than the first voltage level, as shown in FIG. 6b, thus requiring consumption of a considerable amount of current.

In comparison, in the local column driver 201 shown in FIG. 5, according to the second embodiment, the discharge unit 241 discharges the output port VOUT of the local column driver 201 in response to the discharge signal DIS instead of the second charge signal CHA_2. The discharge signal DIS is supplied during a predetermined time delay (tdelay) after the second charge signal CHA_2 begins to be supplied, as shown in FIG. 6a. Therefore, even when there is a time difference (Δt) between the period during which the first charge signal CHA_1 is enabled and the period during which the second charge signal CHA_2 is enabled, the output port VOUT of the local column driver 201 is not discharged, but is maintained at the first voltage level. Therefore, the nonvolatile memory device according to the second embodiment is able to reduce the amount of current consumed in the local column driver 201.

That is, the discharge unit 241 is configured to discharge the output port VOUT of the local column driver 201 in response to the discharge signal DIS. The discharge unit 241 may be an NMOS transistor MN11 coupled between the switch 251 and the ground voltage port, and has a gate to which the discharge signal DIS is applied. In addition, the switch 251 selectively couples the output port VOUT of the local column driver 201 to the discharge unit 241, and is selectively disabled by the second charge signal CHA_2. The switch 251 is coupled between the output port VOUT and the discharge unit 241, and may include an NMOS transistor MN21 having a gate to which the second charge signal CHA_2 is applied.

Figure 7:
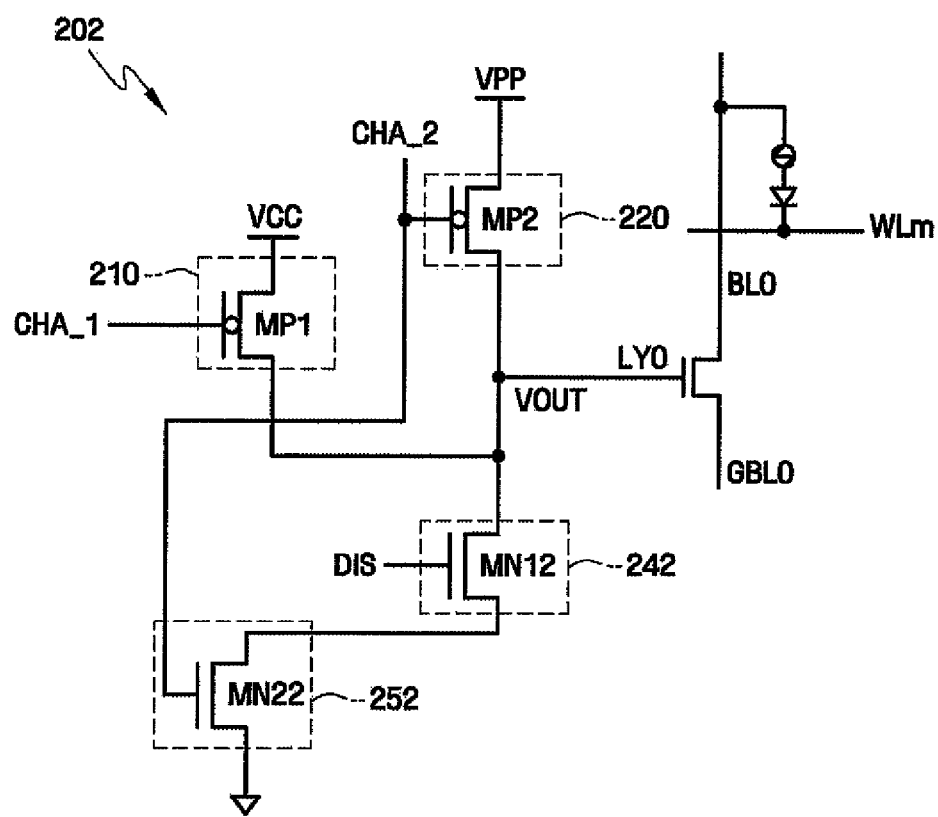
FIG. 7 is a circuit diagram illustrating a representative local column driver of a nonvolatile memory device, according to a third embodiment.

FIG. 7 is a circuit diagram illustrating a representative local column driver of a nonvolatile memory device, according to a third illustrative embodiment of the present inventive concept.

Referring to FIGS. 5 through 7, configurations of the discharge unit 242 and the switch 252 of local column driver 202 shown in FIG. 7 differ from those of the discharge unit 241 and the switch 251 of the local column driver 201 shown in FIG. 5.

More particularly, in the local column driver 202 according to the second embodiment, the discharge unit 242 is configured to discharge the output port VOUT of the local column driver 202 in response to the discharge signal DIS. The discharge unit 242 may be an NMOS transistor MN12 coupled between the output port VOUT of the local column driver 202 and the switch 252, and has a gate to which the discharge signal DIS is applied.

In addition, the switch 252 selectively couples the discharge unit 242 to the ground voltage port, and is selectively disabled by the second charge signal CHA_2. The switch 252 is coupled between the discharge unit 242 and the ground voltage port, and may include an NMOS transistor MN22 having a gate to which the second charge signal CHA_2 is applied.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A nonvolatile memory device using a variable resistive element comprising:
   a memory cell array comprising nonvolatile memory cells arranged in a matrix;
   a plurality of bit lines coupled to columns of the nonvolatile memory cells in the memory cell array;
   a column selection circuit that selects at least one bit line of the plurality of bit lines in response to column selection signals; and
   column drivers that supply the column selection signals, each column driver comprising a first charge unit that charges an output port of the column driver to a first voltage level in response to a first charge signal, a second charge unit that charges the output port of the column driver to a second voltage level from the first voltage level in response to a second charge signal, and a current controller that controls a current path from the second charge unit to the first charge unit.

2. The nonvolatile memory device of claim 1, wherein a first period during which the first charge signal is enabled at least partially overlaps a second period during which the second charge signal is enabled.

3. The nonvolatile memory device of claim 1, wherein the current controller comprises a transistor.

4. A nonvolatile memory device using a variable resistive element comprising:
- a memory cell array comprising nonvolatile memory cells arranged in a matrix;
- a plurality of bit lines coupled to columns of the nonvolatile memory cells in the memory cell array;
- a column selection circuit that selects at least one bit line among the plurality of bit lines in response to column selection signals; and column drivers that supply the column selection signals through corresponding output ports, each column driver varying a voltage level of the output port to a first voltage level in response to a first charge signal and to a second voltage level in response to a second charge signal,
- wherein a time difference period occurs between a first period during which the first charge signal is enabled and a second period during which the second charge signal is enabled, and the output port of the column driver is kept at the first voltage level during the time difference period.

5. The nonvolatile memory device of claim 4, wherein each column driver comprises:
- a first charge unit that charges the output port of the column driver to the first voltage level in response to the first charge signal;

a second charge unit that charges the output port of the column driver to the second voltage level from the first voltage level in response to the second charge signal;
- a discharge unit that discharges the output port of the column driver in response to a discharge signal, the discharge signal being supplied after the second charge signal; and
- a switch coupled between the discharge unit and the output port of the column driver, the switch being disabled in response to the second charge signal.

6. The nonvolatile memory device of claim 4, wherein each column driver comprises:
- a first charge unit that charges the output port of the column driver to the first voltage level in response to the first charge signal;
- a second charge unit that charges the output port of the column driver to the second voltage level from the first voltage level in response to the second charge signal;
- a discharge unit that discharges the output port of the local column driver in response to a discharge signal, the discharge signal being supplied after the second charge signal; and
- a switch coupled between the discharge unit and a ground voltage port, the switch being disabled in response to the second charge signal.

* * * * *